United States Patent [19]
Fujino et al.

[11] Patent Number: 4,901,029
[45] Date of Patent: Feb. 13, 1990

[54] SOLID-STATE HIGH POWER AMPLIFIER ARRANGEMENT

[75] Inventors: Kazuo Fujino; Tetsumichi Yamamoto; Tomohito Ikegami; Takeshi Yanagibayashi, all of Tokyo, Japan

[73] Assignee: NEC Corporation, Japan

[21] Appl. No.: 244,088

[22] Filed: Sep. 14, 1988

[30] Foreign Application Priority Data

Sep. 16, 1987 [JP] Japan ............................ 62-233142

[51] Int. Cl.⁴ ........................ H03F 1/00; H05K 7/20
[52] U.S. Cl. .................................. 330/65; 361/384
[58] Field of Search ............... 330/65; 361/383, 384, 361/391, 393, 394, 422, 423

[56] References Cited
FOREIGN PATENT DOCUMENTS

2537295 4/1976 Fed. Rep. of Germany ...... 361/384
2015361 6/1979 Fed. Rep. of Germany ...... 361/383

Primary Examiner—James B. Mullins
Attorney, Agent, or Firm—Ostrolenk, Faber, Gerb & Soffen

[57] ABSTRACT

A power amplifier arrangement incorporating a plurality of amplifier units and a power supply unit includes a cooling arrangement that is efficient and results in compactness of the overall power amplifier arrangement. The amplifier units and power supply unit are slideable on a shelf through the use of guiderails. Connecting means of the plug-socket type are utilized for connecting the amplifier units with the power supply unit. Cooling air chambers are disposed adjacent to the amplifier units and include nozzles directed onto a radiation plate on which heat-producing amplifier devices are mounted.

12 Claims, 7 Drawing Sheets

SOLID-STATE HIGH POWER AMPLIFIER ARRANGEMENT

BACKGROUND OF INVENTION

The present invention relates to a solid-state high power amplifier arrangement used for a television transmitter, for example, and more particularly to such an arrangement including a plurality of power amplifier units and compulsory air cooling means.

Figure 1:
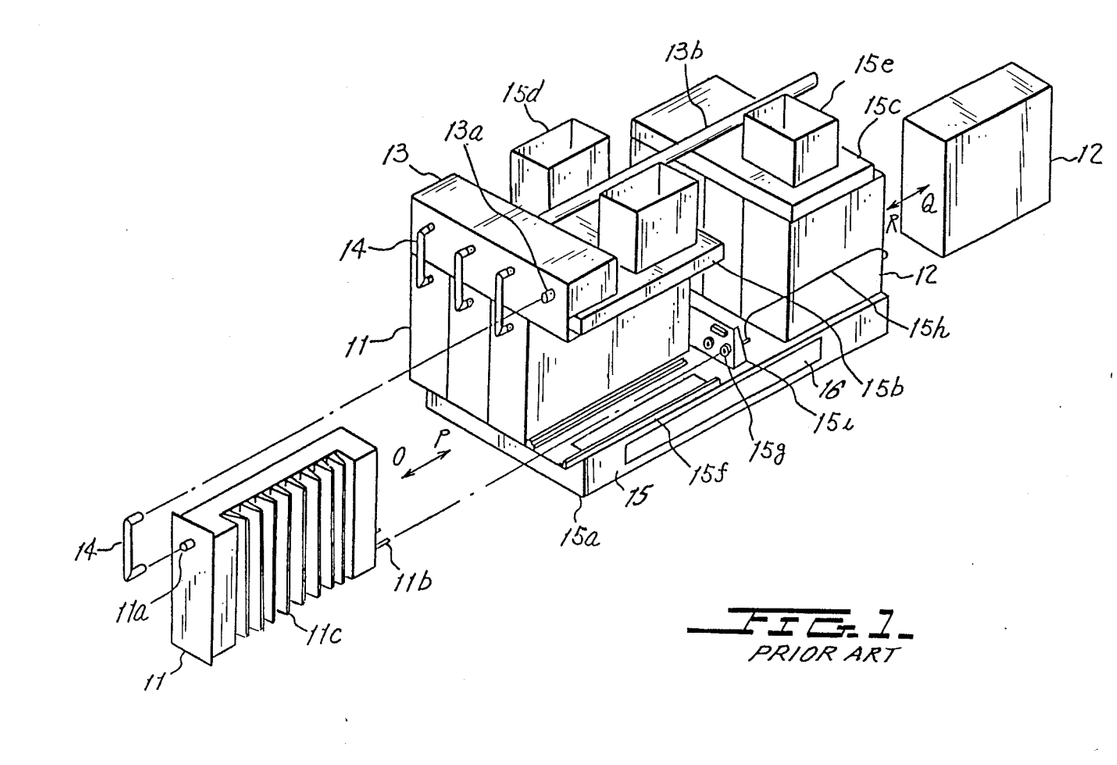
FIG. 1 is a perspective diagram showing a conventional solid-state power amplifier arrangement.
Figure 2A:
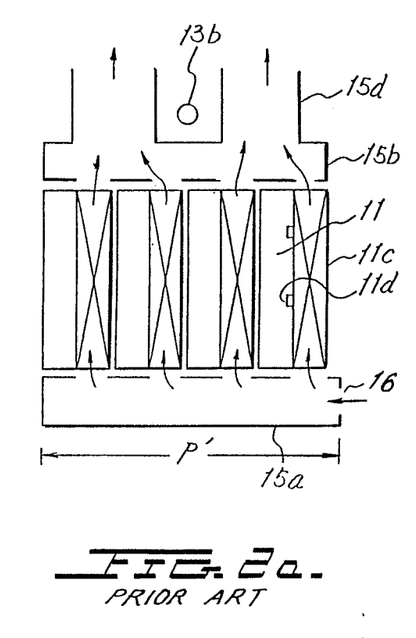
FIGS. 2(a) and 2(b) are sectional-front and -side views of the arrangement shown in FIG. 1, respectively.
Figure 2B:
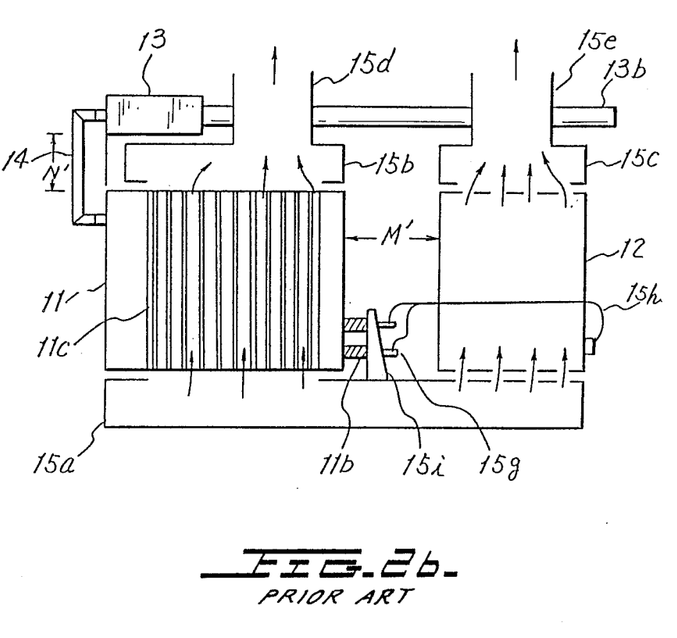

Conventionally, a solid-state high power amplifier arrangement is constructed, as shown in FIG. 1 and FIGS. 2(a) and 2(b), for example.

FIG. 1 shows a plurality of transistor power amplifier units (referred to as "TRPA units") 11; a plurality of power supply units (referred to as "PS units") 12 for supplying electric power; a combiner unit 13 for combining outputs of the plurality of TRPA units 11 to obtain a high power output; and a shelf 15 including individual parts 15a to 15i for accommodating the aforementioned units 11 and 13.

As shown in FIG. 1, each TRPA unit 11 is accommodated in the shelf 15 through guide rails 15f and, at the same time, a plug 11b projected from the unit 11 is connected with a socket 15g. On the other hand, each PS unit 12 is also accommodated on the shelf 15 and the output of the PS unit 12 is connected through the cable 15h with the socket 15g of bracket 15i so that the TRPA unit 11 and the PS unit 12 are electrically connected. Moreover, the combiner unit 13 fixed in advance on the shelf 15 is connected to the TRPA unit 11 through the socket 13a, the plug 11a and a U link 14.

In FIGS. 2(a) and 2(b) showing sectional diagrams of the arrangement of FIG. 1, cooling air 16 is supplied from the side of an air chamber 15a and is distributed into the heat sinks 11c of the TRPA units 11 and into the PS units 12. The cooling air 16 blown into the head sinks 11c cools heating elements 11d through the heat sinks 11c and, then air 16, is exhausted through an air chamber 15b and an exhaust duct 15d. On the other hand, the cooling air blown to the PS unit 12 is exhausted through an air chamber 15c and an exhaust duct 15e.

In the aforementioned conventional solid-state high power amplifier arrangement shown in FIGS. 2(a) and 2(b), space M' between the TRPA unit 11 and the PS unit 12 has to be enlarged in a unit-accommodating direction because of the presence of the bracket 15i and the cable 15h. Moreover, space N' between the TRPA unit 11 and the combiner unit 13 has to be enlarged because of the presence of the air chamber 15b. Still moreover, the total width P' becomes enlarged because of the presence of the heat sinks 11c. In addition to the units 11 and 12, on the other hand, the cable 15h, the U links 14 and the bracket 15i are required for electric connections, and the air chambers 15b and 15c and the exhaust ducts 15d are required for protection against the heat of the exhaust air.

The aforementioned requirements of the conventional arrangement increase cost of the parts and the number of assembling and wiring steps, and, much time is necessary to insert or pull out the individual units. Further, the TRPA units 11 are heavy due to the heaviness of heat sinks 11c so that maintenance of the units 11 is troublesome. Incidentally, the heat sinks 11c are troubled by deteriorating the cooling effect because temperature of the cooling air at the downstream is raised depending upon the flow direction of the cooling air.

Moreover, the conventional arrangement is further troubled with a safety risk because the U links interconnecting the high power outputs are disposed at the front.

SUMMARY OF THE INVENTION

It is, therefore, an object of the present invention to provide a solid-state high power amplifier arrangement with compactness light weight and good cooling efficiency.

It is further an object of the present invention to provide a solid-state high power amplifier arrangement which is easy to assemble and to maintain.

According to the present invention, there is provided a solid-state power amplifier arrangement including a plurality of amplifier units, a power supply unit for supplying a power source to the amplifier units and a combiner unit for combining outputs of the amplifier units. The arrangement comprises guide rails for guiding the amplifier units and the power supply unit onto a shelf: connectors for connecting the amplifier units with the power supply unit and connecting the amplifier units with the combiner unit, the connectors being a plug-socket type; air chambers disposed between the adjacent amplifier units, respectively; and nozzles attached to the air chambers so as to jet cooling air onto a radiation plate of the amplifier units.

BRIEF DESCRIPTION OF DRAWINGS

The above objects as well as other objects of this invention shall become readily apparent after reading the following description of the accompanying drawings in which.

PREFERRED EMBODIMENT OF THE INVENTION

Figure 3:
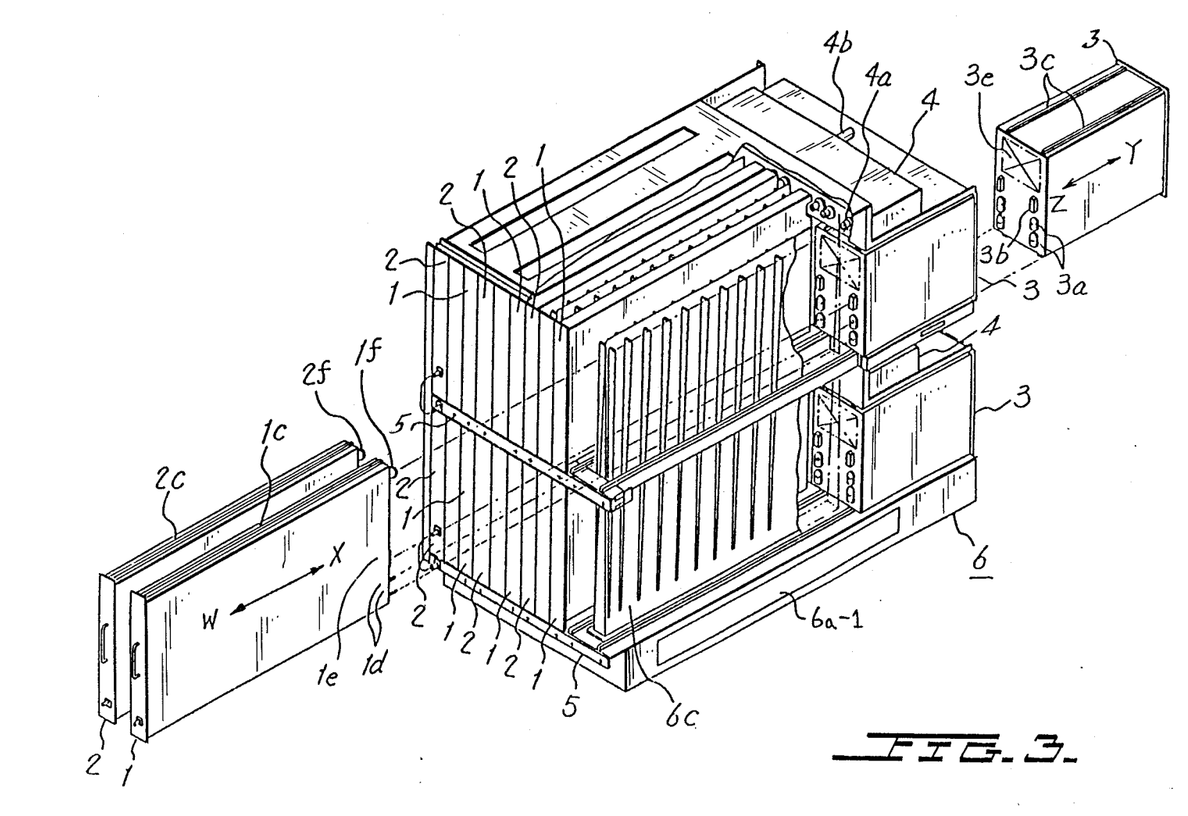
FIG. 3 is a perspective view showing an embodiment according to the present invention.

In FIG. 3 showing an embodiment of the present invention, a solid-state high power amplifier arrangement is constructed of: a plurality of transistor power amplifier units (referred to as "TRPA units" hereinafter) 1 and 2; a plurality of power supply units 3 (referred to as "PS units" hereinafter) for providing an electric power source for the TRPA units 1 and 2; a signal dividing unit 5 for dividing a pre-amplified signal having a weak power into the TRPA units 1 and 2; combiner units 4 for combining outputs of the TRPA units 1 and 2 to deliver a high power output; a shelf 6 for accommodating the above-specified units 1 to 5; and air chambers 6a and 6b for blowing cooling air to cool the TRPA units 1 and 2 and the PS units.

Figure 4:
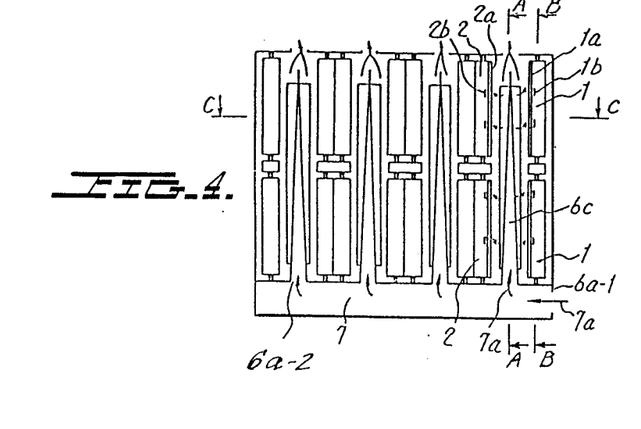
FIG. 4 is a sectional-front view of the embodiment shown in FIG. 3.

As shown in FIGS. 3 and 4, the TRPA unit 1 comprises: a flat plate 1a (aluminum, for example) of high thermal conductivity which is disposed at the lefthand outer side and is used as a part of a casing by itself; heating elements 1b such as power transistors attached to the inner side of the flat plate 1a; guide rails 1c running on the top and bottom faces of the unit; a power supply plug 1d disposed on the back face; and a coaxial plug 1f to deliver an amplified output to the combiner unit 4. The TRPA unit 2 has a similar construction.

Figure 8A:
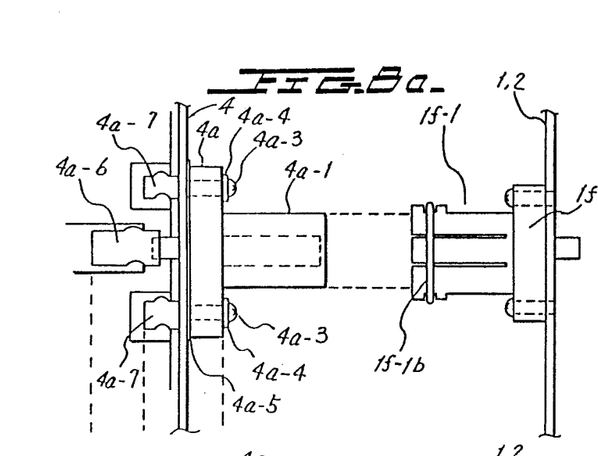
FIGS. 8(a) and 8(b) show a coaxial plug and a socket applied to the embodiment of FIG. 3.
Figure 8B:
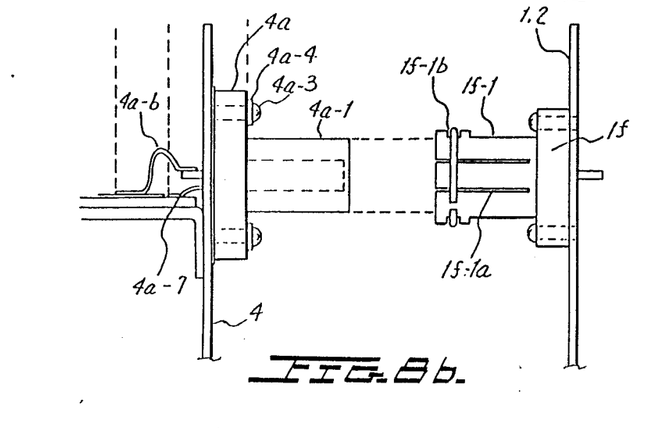
Figure 9:
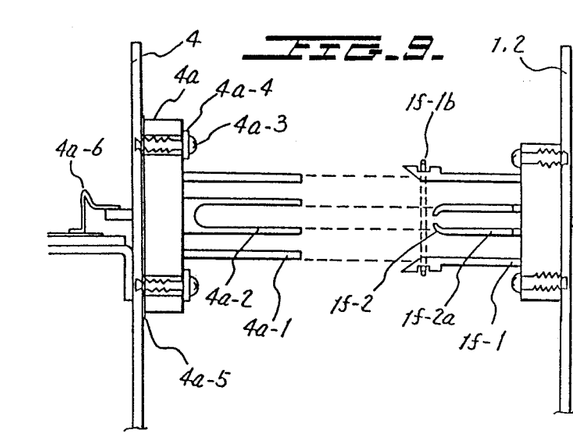
FIG. 9 is a sectional view of the plug and the socket shown in FIGS. 8(a) and 8(b)
Figure 10:
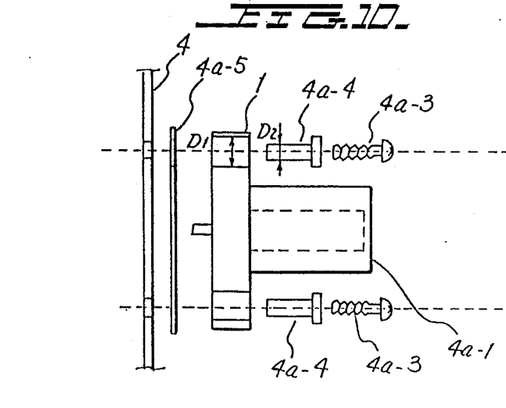
FIG. 10 is a breakdown view of the socket shown in FIG. 9.

The plug 1f is composed, as shown in FIGS. 8(a) and 8(b) and in FIG. 9, of outer conductors 1f-1 and inner conductors 1f-2, each of which is formed with a plurality of axial slits 1f-1a and 1f-2a, respectively, so that they have a spring property. Moreover, the output conductor 1f-1 has its leading end portion clamped by a ring 1f-1b having a spring property and its inner side counter-tapered to provide a wider opening. The TRPA unit 2 has a construction similar to that of the TRPA unit 1 except that a plate 2a of a high thermal conductivity is disposed at the righthand outer side, as shown in FIG. 4.

The PS unit 3 is equipped, as shown in FIG. 3, with: sockets 3a and 3b disposed at the side which faces the TRPA units 1 and 2 to be joined to the plugs 1d and 1e of the TRPA units 1 and 2; guide rails 3c disposed on the upper and bottom faces; blower holes 3d (FIG. 5) formed in the bottom face; and exhaust ports 3e formed in the side which faces the TRPA units 1 and 2, wherein cooling air is blown through the hole 3d and the ports 3e.

The combiner unit 4 is equipped with: coaxial sockets 4a to be joined to the plugs 1f of the TRPA units 1 and 2; and a coaxial plug 4b disposed at the opposite side to deliver a combined output.

With reference to FIGS. 8(a), 8(b), 9 and 10, the socket 4a is composed of: an outer conductor 4a-1; an inner conductor 4a-2; screws 4a-3 to fix the socket in a floating manner on the panel of the combiner unit 4; insulating bushings 4a-4; an insulating sheet 4a-5; flexible ribbon conductors 4a-6 to transmit high-frequency high-power signal; and flexible ribbon conductors 4a-7 to ground the outer conductor 4a-1 and the inside of the combiner unit 4 to the earth. In this case, the insulating sheet 4a-5 is inserted between the panel of the combined unit 4 and the outer conductor 4a-1, and the outer conductor 4a-1 is fastened by means of the screws 4a-3 through the insulating bushings 4a-4 with a margin ($D_1 > D_2$). Therefore, the panel of the combiner unit 4 and the outer terminal 4a-1 are fastened with the floating structure having the margin of one to several millimeters. To make up the floating structure, on the other hand, the outer conductor 4a-1 and the inner conductor 4a-2 are connected with the inside of the combiner unit through the flexible ribbon conductors 4a-6 and 4a-7.

Figure 11:
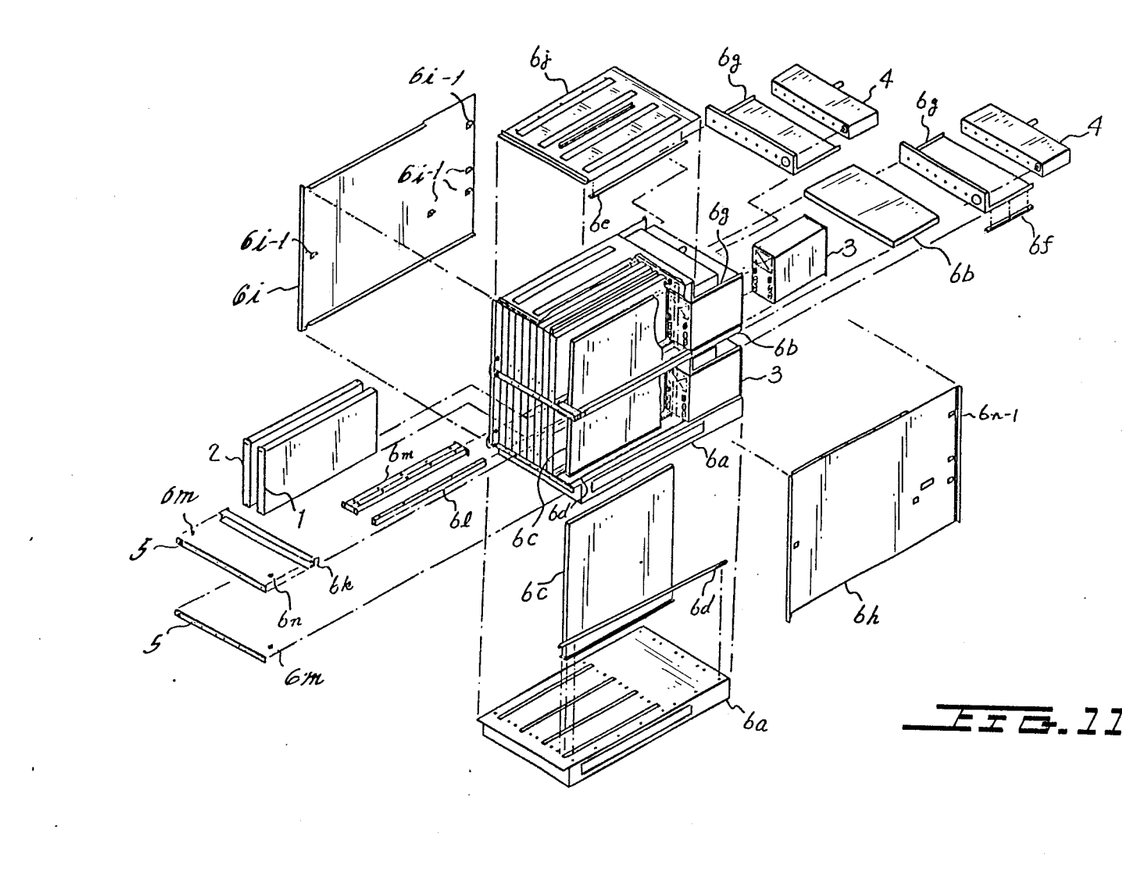
FIG. 11 is a perspective breakdown view of the embodiment shown in FIG. 3.

FIG. 11 is a breakdown perspective view showing the shelf 6. In FIG. 11, the shelf 6 is composed of the air chambers 6a and 6b, a plurality of blower ducts 6c, a plurality of guide rails 6d, 6e and 6f, a plurality of shelf plates 6g, side plates 6h and 6i, a top plate 6j and other members 6k to 6n. As shown in FIG. 4, the air chamber 6a is formed with: an intake port 6a-1 in its side, for example; a plurality of blower ports 6a-2 in its upper face to deliver cooling air to TRPA units 1 and 2 of upper and lower sides; and a plurality of blower ports 6a-3 in its upper face to deliver cooling air to the PS unit 3 of the lower side. The other air chamber 6b is formed with: an intake port 6b-1 in its side; and a plurality of blower ports 6b-2 in its upper face to deliver cooling air to the upper PS unit 3.

Figure 12A:
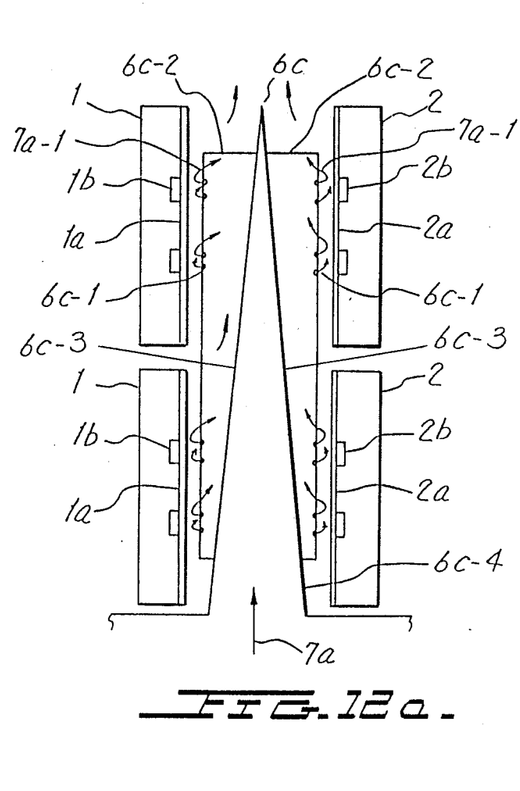
FIGS. 12(a) and 12(b) are detailed sectional-side and -plane views of a cooling part applied to the embodiment.
Figure 12B:
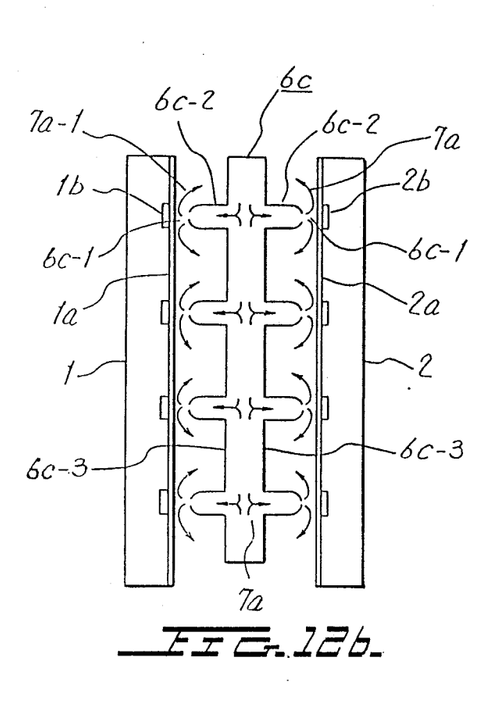

The blower duct 6c is disposed, as shown in FIGS. 12(a) and 12(b), at a location of a constant gap from the flat plates 1a and 2a of the TRPA units 1 and 2, and comprises: a plurality of U-sectional shaped nozzles 6c-2 having jet ports 6c-1 which is located at a location corresponding to the heating elements 1b and 2b; and an air chamber 6c-4 which is joined to the nozzles 6c-2 has upwardly sloped faces (taper shape) 6c-3 with respect to the flat plates 1a and 2a. The nozzles 6c-2 are arranged in the depthwise direction of the sloped faces 6c-3.

In FIG. 11, the guide rails 6d are installed to be fitted to the guide rails 1c, 2c and 3c, which are formed on the bottom faces of the TRPA units 1 and 2 and the PS units 3 as shown in FIG. 3, and have a length equal to or more than the total length of the TRPA units 1 or 2 and the PS units 3. Thus, the guide rails 6d guide the units 1 and 2 and the unit 3 in the directions W - X and Y - Z. The guide rails 6e are equipped to be engaged with the guide rails 1c and 2c, which are formed on the upper faces of the TRPA units 1 or 2, and have a length equal to or more than that of the TRPA units 1 and 2 to guide them in the directions W - X. Further, the guide rails 6f are installed to be fitted in the guide rails 3c, which are formed on the upper faces of the PS units 3, and have a length equal to or more than that of the PS units 3 to guide them in the directions Y - Z.

The shelf plates 6g are formed with holes, which are sized larger than the external sizes of the sockets 4a of the combiner unit 4, so that they can accommodate the combiner unit 4 and the guide rails 6f thereto. Assembly of the shelf 6 thus constructed is accomplished in the following manner. The air chamber 6a is disposed in the bottom. The blower duct 6c is so attached to the air chamber 6a as to cover the blower port 6a-2 of the chamber 6a. Then, the guide rails 6d are attached, and the side plates 6h and 6i are attached to the lefthand and righthand ends. To these side plates 6h and 6i, the shelf plates 6g, to which have been attached the guide rails 6f, are attached at the vertical center and the upper end. The air chamber 6b is placed on the central shelf plate 6g. The members 6k are attached to the fronts of the side plates 6h and 6i at the same level as that of the air chamber 6b.

Members 6l are attached to the inner centers of the side plates 6h and 6i at the same level as that of the air chamber 6b. Members 6m are interposed between the air chamber 6b and the members 6k. The guide rails 6e are attached to the lower faces of the members 6k, 6l and 6m. The guide rails 6d are attached to the upper faces of the members 6k, 6l and 6m and the air chamber 6b. The top plate 6j, to which have been attached the guide rails 6e in advance, is attached to the upper ends of the side plates 6h and 6i and the upper end of the shelf plate 6g which in turn is disposed at the upper portion. Finally, the members 6m are so attached to the side plates 6h and 6i that they are positioned between the two ends of the members 6k.

Here, the side plates 6h and 6l are formed with positioning plates 6h-1 and 6i-1 so that the air chamber 6b, the shelf 6g and the members 6k may be positioned slightly higher than the guide rails 1c, 2c and 3c of the TRPA units 1 or 2 and the PS units 3. Thus, no level adjustment is required so as to simplify the assembly.

Next, a method of mounting the units will be described in the following. In FIGS. 1 and 9, the combiner units 4 are fixed on the plates 6g of the shelf 6, and the dividing units 5 are fixed on the members 6n. When the TRPA units 1 and 2 and the PS units 3 are to be mounted, the TRPA units 1 and 2 are mounted on the shelf 6 while being guided in the directions W - X on the guide rails 6d and 6e of the shelf 6, whereas the PS units 3 are guided from the opposite side in the directions Y - Z on the guide rails 6d and 6f. Then, the units 1, 2 and 3 are accommodated in the shelf 6, and the plugs 1d, 1e and 1f are jointed to the sockets 3a, 3b and 4a.

In the mounting operations, though a small misalignment occurs between the plugs and sockets due to manufacture and assembly errors, by means of the aforementioned floating structures of the sockets 3a, 3b and 3c, accurate jointing can be established. Further, according to the present invention, stable electric contact between the plugs 1f and the sockets 4a is accomplished by means of the rings 1f-1b. Thus, the TRPA units 1 and 2, the PS units 3 and the combiner units 4 are electrically connected, completely. Furthermore, since the amplified power output of the high frequency is transmitted through the plug 1f and the socket 4a, leakage of a high frequency output may be derived from the socket 4a, in general. However, in the embodiment, such leakage can be avoided by inserting the insulating sheet 4a-5 between the panel of the unit 4 and the other conductor 4a-1, so as to form a capacitor.

Next, the cooling operation of the present invention will be described in the following with reference to FIGS. 4 to 7 and FIGS. 12(a) and 12(b). In FIG. 4, the cooling air 7 to cool the upper and lower TRPA units 1 and 2 and the lower PS units 3 is blown from the intake port 6a-1 of the air chamber 6a and is distributed to the individual blower ducts 6c and to the lower PS units 3. As shown in FIGS. 12(a) and 12(b), the cooling air 7a distributed into the individual blower ducts 6c are injected, through nozzles 6c-2 and jet injection ports 6c-1 so as to impinge upon the flat plates 1a and 2a, thereby to cool the heating elements 1b and 2b.

Here, the nozzles 6c-2 have large port size, as compared with the diameters of the jet injection ports 6c-1 so that the resulting flow velocity is relatively lower with a low pressure loss (drop). Since the pressure drop to the jet injection ports 6c-1 is as low as negligible, the flow velocities of the jets 7a-1 can be in high speed and accordingly the heat transfer coefficient is increased. Since, moreover, the heating elements 1b and 2b are cooled by the jets 7a-1 at the same temperature notwithstanding their locations in the vertical direction, the heat transfer coefficient is also increased while preventing irregularity of cooling effect dependent on the vertical locations of the heating elements, thus increasing the cooling efficiency. According to the present invention, the heat transfer coefficient is further increased because the heating elements 1b and 2b are locally cooled by the jets 7a-1.

Incidentally, the following equation holds between the amount of heat radiation Q and the heat transfer coefficient α:

$$Q = \alpha \cdot A \cdot \Delta T,$$

wherein

A is the area of heat radiation; and

ΔT is the temperature difference.

On the other hand, the jets 7a-1 having taken the heat from the flat plates 1a and 2a flow along the nozzles 6c-2 and between the flat plates 1a and 2a and the air chamber 6c-4 until they are discharged to the outside. Since, at this time, the space between the flat plates 1a and 2a and the air chamber 6c-4 are diverged toward the exhaust ports due to the taper shape of the air chamber 6c-4, the flow speed in the exhaust ports is not increased, and, therefore, it is not necessary to positively enlarge the space between the flat plates 1a and 2a and the air chamber 6c-4. This feature enables the arrangement to be compact.

Figures 5, 6:
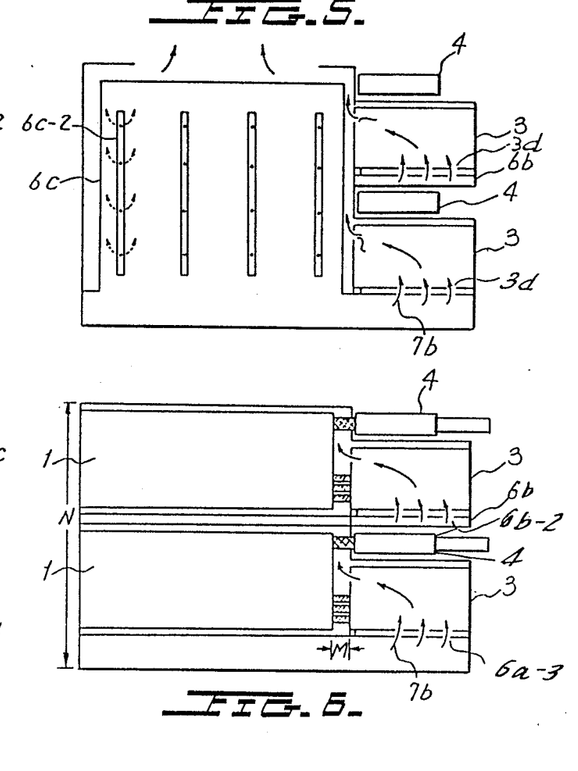
FIG. 5 is a sectional-side view at A—A of FIG. 4.
FIG. 6 is a sectional-side view of B—B of FIG. 4.
Figure 7:
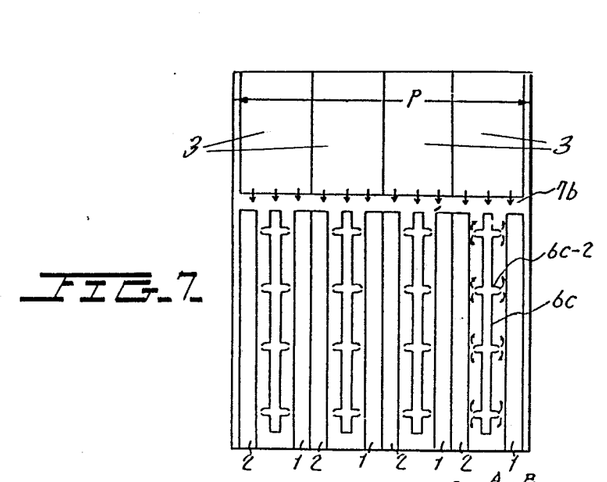
FIG. 7 is a sectional plane diagram at C—C of FIG. 4.

As shown in FIGS. 5 and 6, on the other hand, the cooling air 7b distributed to the lower PS unit 3 cools its inside and after this, flows through the exhaust portions of the TRPA units 1 and 2. Thus, the exhaust air from the PS unit 3 is exhausted together with the exhaust air from the TRPA units 1 and 2. Moreover, the cooling air for the upper PS unit 3 is supplied from the side of the air chamber 6b and it flows like that of the lower PS unit 3. Accordingly, it is unnecessary to provide exhaust ducts for the PS units 3, especially.

As has been described above, according to the present invention, space M (indicated in FIG. 6) between the TRPA units and the PS units can be reduced to be equal to the size, at most, of the plugs 1d and 1e and the sockets 3a and 3b in the jointed states. The height N (FIG. 6) can be reduced substantially to that of the TRPA units. Moreover, the width P (indicated in FIG. 7) can also be reduced to a reasonably small width because the blower ducts 6c have the featured shape to be sloped with respect to the flat plates 1a and 2a. Further, by inserting the individual units into the shelf, all the electric jointing points are connected by the connectors so that wiring assembly is zero.

Moreover, the TRPA units 1 and 2 can be made with a flat shape, so that the arrangement can be compact and light in weight notwithstanding that it incorporates a high power amplifier. Furthermore, the arrangement of the present invention can be manufactured at a reasonably low cost with excellent maintenability. Incidentally, electrical lines (the plug-socket means) transmitting high power are concealed inside so as to insure safety.

What is claimed is:

1. A power amplifier arrangement comprising:
    an air chamber having a flat face thereon, said flat face including a plurality of ports to deliver cooling air;
    a plurality of blower ducts disposed on said flat face of said air chamber to receive said cooling air from said ports, each of said blower ducts having an upwardly-tapered shape;
    a plurality of amplifier units disposed on said flat face of said air chamber and respectively disposed beside said blower ducts, each of said amplifier units having a flat plate on which a plurality of transistors are fitted; and
    a plurality of nozzles attached to each of said blower ducts for directly blowing said cooling air onto said flat plate of said amplifier unit, wherein space between adjacent two of said amplifier units operates as an exhaust duct, said space containing each of said blower ducts, and said exhaust duct having a substantialy upwardly-widened shape.

2. A power amplifier arrangement as claimed in claim 1, further comprising a power supply unit disposed on said flat face of said air chamber and disposed behind said amplifier units, said power supply unit having ports in the bottom thereof to receive said cooling air.

3. A power amplifier arrangement as claimed in claim 2, further comprising a combiner unit for combining outputs of said plurality of amplifier units, said combiner unit being disposed above said power supply unit and disposed behind said power amplifier units.

4. A power amplifier arrangement as claimed in claim 3, further comprising first connector means for supplying power from said power supply unit to said amplifier units and second connector means for transmitting outputs of said amplifier units to said combiner unit, said first and second connector means being of a plug-socket type.

5. A power amplifier arrangement as claimed in claim 4, further comprising sliding means for sliding said amplifier units and said power supply unit on the flat face of said air chamber, wherein said first and second conductor means are operative when said amplifier units and said power supply unit are disposed at predetermined locations on said sliding means.

6. A power amplifier arrangement as claimed in claim 1, wherein said plurality of nozzles are respectively directed to locations on said flat plate that are locally adjacent respective ones of said transistors.

7. An integrated power amplifieer arrangement comprising a plurality of amplifier units, a power supply unit and a combiner unit said amplifier units and said power supply unit being accommodated in a shelf while being slidable on said shelf, and further comprising;
 guide rails for guiding said amplifier units and said power supply unit on said shelf;
 first connecting means for connecting said amplilfier units with said power supply unit when said amplifier units and said power supply unit are disposed at predetermined locations on said guide rails, said connecting means being of a plug-socket type;
 second connecting means for connecting said amplifier units with said combiner unit to transmit outputs delivered from said amplifier units to said combiner unit when said amplifier units are disposed at the predetermined locations on said guide rails, said connecting means being of a plug-socket type;
 air ducts respectively disposed adjacent to said amplifier units for blowing out cooling air, said air ducts having an upwardly-taped shape; and
 nozzles attached to said air ducts to directly jet said cooling air onto a radiation plate of said amplifier units, wherein space provided between adjacent pairs of said amplifier units serves as an exhaust duct through which reflected cooling air from said radiation plate is exhausted.

8. An integrated power amplifier arrangement as claimed in claim 7, wherein said nozzles are respectively directed to locations on said radiation plate that are locally adjacent respective heat-producing amplifier devices.

9. A power amplifier arrangement comprising:
 an air chamber having a flat face thereon, said flat face including a plurality of ports to deliver cooling air;
 a plurality of blower ducts disposed on said flat face of said air chamber to receive said cooling air from said ports;
 a plurality of amplifier units disposed on said flat face of said air chamber, each pair of adjacent ones of amplifier units being disposed on opposite sides of a respective one of said blower ducts;
 a power supply unit disposed on said flat face of said air chamber and disposed behind said amplifier units for supplying power to said amplifier units, said power supply unit having ports in the bottom thereof to receive said cooling air;
 guide rails for guiding said amplifier units and said power supply unit on said flat face of said air chamber;
 a plurality of nozzels attached to both sides of each of said blower ducts for directing jetting and cooling air onto a surface of said amplifier units;
 first connecting means for connecting said amplifier units with said power supply unit when said amplifier units and said power supply unit are disposed at predetermined locations through said guide rails, said first connecting means being of a plug-socket type;
 a combiner unit disposed above said power supply unit and disposed behind said amplifier units for combining outputs of said plurality of amplifier units;
 second connecting means for connecting said amplifier units with said combiner unit to transmit the outputs of said plurality of amplifier units to said combiner unit when said amplifier units are disposed at the predetermined location through said guide rails, said second connecting means being of a plug-socket type, wherein space between said pair of amplifier units serves as an exhaust duct through which reflected cooling air from said surface of said amplifier units is exhausted.

10. A power amplifier arrangement as claimed in claim 11, wherein each of said blower ducts has an upwardly-tapered shape and said exhaust duct has a correspondingly upwardly-widened shape.

11. A power amplifier arrangement as claimed in claim 9, wherein said second connecting means includes;
 a coaxial plug means containing an outer conductor and an inner conductor, both having axial slits;
 a ring means for clamping a leading end portion of said outer conductor; and
 a coaxial socket means.

12. A power amplifier arrangement as claimed in claim 9, wherein said plurality of nozzles are spatially disposed at a constant distance from said surface of said amplifier units.

* * * * *